United States Patent [19]
Tokunaga et al.

[11] Patent Number: 6,074,958
[45] Date of Patent: Jun. 13, 2000

[54] SEMICONDUCTOR INTEGRATED CIRCUIT ARRANGEMENT FABRICATION METHOD

[75] Inventors: Takafumi Tokunaga, Iruma; Sadayuki Okudaira, Ohme; Tatsumi Mizutani, Koganei; Kazutami Tago, Hitachinaka; Hideyuki Kazumi, Hitachi; Ken Yoshioka, Kudamatsu, all of Japan

[73] Assignee: Hitachi, Ltd., Tokyo, Japan

[21] Appl. No.: 09/339,041

[22] Filed: Jun. 23, 1999

Related U.S. Application Data

[63] Continuation of application No. 09/188,371, Nov. 10, 1998, Pat. No. 5,962,347, which is a continuation of application No. 08/857,167, May 15, 1997, Pat. No. 5,874,013, which is a continuation of application No. 08/472,459, Jun. 7, 1995, abandoned.

[30] Foreign Application Priority Data

Jun. 13, 1994 [JP] Japan .................................. 6-130232

[51] Int. Cl.[7] .................................................. H01L 21/00
[52] U.S. Cl. ............................................ 438/724; 438/744
[58] Field of Search ................................... 438/723, 724, 438/726, 728, 732, 740, 743, 744; 216/67, 69, 79

[56] References Cited

U.S. PATENT DOCUMENTS

| | | |
|---|---|---|
| 4,615,756 | 10/1986 | Tsujii et al. . |
| 4,966,870 | 10/1990 | Barber et al. ........................ 438/740 X |
| 5,188,975 | 2/1993 | Kojima et al. . |
| 5,269,879 | 12/1993 | Rhodes et al. ....................... 438/728 X |
| 5,290,383 | 3/1994 | Koshimizu . |
| 5,324,388 | 6/1994 | Yamano et al. . |
| 5,476,182 | 12/1995 | Ishizuka et al. . |
| 5,880,036 | 3/1999 | Becker et al. ........................... 438/740 |

FOREIGN PATENT DOCUMENTS

| | | |
|---|---|---|
| 3-109728 | 5/1991 | Japan . |
| 4-370934 | 12/1992 | Japan . |

*Primary Examiner*—William Powell
*Attorney, Agent, or Firm*—Beall Law Offices

[57] ABSTRACT

To realize etching with a high selection ratio and a high accuracy in fabrication of an LSI, the composition of dissociated species of a reaction gas is accurately controlled when dry-etching a thin film on a semiconductor substrate by causing an inert gas excited to a metastable state in a plasma and a flon gas to interact with each other and selectively obtaining desired dissociated species.

9 Claims, 12 Drawing Sheets

SEMICONDUCTOR INTEGRATED CIRCUIT ARRANGEMENT FABRICATION METHOD

This is a continuation application of U.S. Ser. No. 09/188,371, filed Nov. 10, 1998, now U.S. Pat. No. 5,962,347; which is a continuation application of U.S. Ser. No. 08/857,167, filed May 15, 1997, now U.S. Pat. No. 5,874,013; which is a File Wrapper Continuation of U.S. Ser. No. 08/472,459, filed Jun. 7, 1995, now abandoned.

BACKGROUND OF THE INVENTION

The present invention relates to the art of semiconductor integrated circuit arrangement fabrication, and particularly to an art for dry-etching a thin film on a semiconductor wafer by using radicals or ions in a plasma.

A silicon oxide film which is a typical insulating film used to fabricate an LSI is normally processed by a dry-etching system (plasma etching system) using a plasma process.

In the case of an etching process using a typical magneto-microwave plasma etching system, a vacuum chamber of the etching system comprising a reaction chamber (etching chamber) and a discharge chamber is first evacuated up to approx. $10^{-6}$ Torr by an evacuating system and then a reaction gas is introduced into the vacuum chamber through a needle valve to a predetermined pressure (approx. $10^{-5}$ to $10^{-1}$ Torr).

The etching of a silicon oxide film deposited on a silicon wafer uses, for example, a fluorocarbon gas such as $CF_4$, $C_2F_6$, $C_3F_8$, or $C_4F_8$ and a hydrogen-containing fluorocarbon gas such as $CHF_3$ or $CH_2F_2$ or a mixed gas of a fluorocarbon-based gas and hydrogen. Hereafter, these gases are generally referred to as flon gases.

Microwaves of 1 to 10 GHz (ordinarily of 2.45 GHz) generated by a microwave generator (ordinarily a magnetron) are propagated through a wave guide and are introduced into a discharge tube forming a discharge chamber. The discharge tube is made of an insulating material (ordinarily quartz or alumina) in order to pass microwaves.

A magnetic field is locally formed in the discharge and reaction chambers by an electromagnet and a permanent magnet. When a microwave electric field is introduced into the discharge chamber under the above state, magnetic-field microwave discharge occurs due to a synergistic action between the magnetic field and the microwave electric field, and a plasma is formed.

In this case, the reaction gas dissociates in the plasma and thereby various radicals and ions are generated. Dissociation of the reaction gas is caused because electrons in reaction gas molecules collide with those in the plasma or absorb light, and thereby become excited to antibonding orbitals. These dissociated species are supplied to the surface of a silicon oxide film to participate in the etching of the silicon oxide film while dissociation species influence the dry-etching characteristics in a complex way.

A dry etching system using this type of plasma process is disclosed in Japanese Patent Laid-Open No. 109728/1991.

SUMMARY OF THE INVENTION

An electronic device such as a silicon LSI or a TFT (thin-film transistor) has a structure in which a silicon oxide film of an object material to be dry-etched is deposited on a silicon film (e.g. silicon substrate, silicon epitaxial film, or polysilicon film), silicon nitride film, or a multilayer film made of these films.

In the case of an electronic device with a high integration level, it is possible to open a contact hole with a diameter of 0.5 $\mu$m or less and a high aspect ratio (hole depth/hole diameter), and moreover etching with a high accuracy and a high selection ratio is necessary, while minimizing the etching amount of a base silicon film, silicon nitride film, or a multilayer film made of these films.

To realize such an etching, it is necessary to accurately control the composition of dissociated species of a reaction gas. However, it is difficult to realize this control by a conventional etching method using dissociation of reaction gas molecules caused by collision of electrons in a plasma.

This is because selective excitation by electrons can be realized only on antibonding orbitals of the minimum energy, but electrons with uniform energy necessary for realizing it cannot be obtained in a plasma. Therefore, it is necessary to produce electrons with uniform energy outside and introduce them into the plasma or introduce a light source with a uniform energy into the plasma. In this case, however, the cost of the etching system greatly increases.

It is an object of the present invention to provide a technique of realizing etching with a high selection ratio and a high accuracy.

The above and other objects and novel features of the present invention will become apparent from the description of this specification and accompanying drawings.

The outline of representatives embodiments of the inventions disclosed in this application will be briefly described below.

(1) In a semiconductor integrated circuit arrangement fabrication method of the present invention, desired dissociated species are produced by allowing an inert gas excited to a metastable state in a plasma and a reaction gas necessary for dry-etching a thin film on a semiconductor substrate to interact with each other when dry-etching the thin film.

(2) In a semiconductor integrated circuit arrangement fabrication method of the present invention according to the method (1), the dissociation of the reaction gas caused by collision with electrons is reduced by separating a plasma generation chamber of a plasma dry-etching system from the reaction chamber, and preventing electrons in the plasma from entering the reaction chamber.

(3) In a semiconductor integrated circuit arrangement fabrication method of the present invention, desired dissociated species are selectively produced by allowing an inert gas excited to a metastable state in a plasma and a flon gas to interact with each other when dry-etching a silicon oxide film on a semiconductor substrate.

(4) In a semiconductor integrated circuit arrangement fabrication method of the present invention according to the method (3), the flon gas is a chain perfluorocarbon with two or more carbon atoms.

(5) In a semiconductor integrated circuit arrangement fabrication method of the present invention according to the method (3), the flon gas is a chain perfluorocarbon with two to six carbon atoms.

(6) In a semiconductor integrated circuit arrangement fabrication method of the present invention according to the method (3), the flon gas is a cyclic perfluorocarbon with three or more carbon atoms.

(7) In a semiconductor integrated circuit arrangement fabrication method of the present invention according to the method (3) the inert gas is one or more rare gases selected out of the group of He, Ne, Ar, Kr, and Xe.

(8) In a semiconductor integrated circuit arrangement fabrication method of the present invention according to the method (3), dissociated species with a high selection ratio to silicon nitride are produced.

(9) In a semiconductor integrated circuit arrangement fabrication method of the present invention according to the method (3), the proportion of the inert gas to the total gas flow rate is 50% or more and the processing pressure is 100 mTorr to 1 Torr.

(10) In a semiconductor integrated circuit arrangement fabrication method of the present invention according to the method (3), the proportion of the inert gas to the total gas flow rate is 80% or more and the processing pressure is 100 to 500 mTorr.

(11) In a semiconductor integrated circuit arrangement fabrication method of the present invention according to the method (3), an inorganic material is used as a mask for dry etching.

(12) In a semiconductor integrated circuit arrangement fabrication method of the present invention, desired dissociated species are selectively produced by allowing an inert gas excited to a metastable state in a plasma and a flon gas to interact with each other when a silicon nitride film on a semiconductor substrate is dry-etched.

(13) In the semiconductor integrated circuit arrangement fabrication method of the present invention according to the method (12), dissociated species with a high selection ratio to silicon are produced by using one or more rare gases selected out of the group of He, Ar, Kr, and Xe as the inert gas and difluoromethane as the flon gas.

(14) In a semiconductor integrated circuit arrangement fabrication method of the present invention according to the method (3), the proportion of the inert gas of the total gas flow rate is 80% or more and the processing pressure is 100 to 500 mTorr.

(15) A semiconductor integrated circuit arrangement fabrication method of the present invention comprises the following steps (a) to (d):

(a) forming a field insulating film with a LOCOS structure on a main surface of a semiconductor substrate and thereafter forming a semiconductor element in an active region enclosed by the field insulating film, (b) depositing a first insulating film on the whole surface of the semiconductor substrate and thereafter depositing a second insulating film at an etching rate different from that of the first insulating film on the first insulating film, (c) selectively producing dissociated species for maximizing the selection ratio of the second insulating film to the first insulating film by allowing an inert gas excited to a metastable state in a plasma and a flon gas to interact with each other and etching the second insulating film by using the dissociated species, and (d) selectively producing dissociated species for maximizing the selection ratio of the first insulating film to the semiconductor substrate by allowing an inert gas excited to a metastable state in a plasma and a flon gas to interact with each other, and making a contact hole connected to the semiconductor substrate and locally overlapped with the field insulating film by etching the first insulating film with the dissociated species.

(16) In a semiconductor integrated circuit arrangement fabrication method of the present invention according to the method (15), the second insulating film is etched by using an inorganic material deposited on the second insulating film as a mask.

(17) In a semiconductor integrated circuit arrangement fabrication method of the present invention according to the method (15), the diameter of the contact hole is 0.3 µm or less.

(18) In a semiconductor integrated circuit arrangement fabrication method of the present invention according to the method (16), the mask made of the inorganic material is formed from the same material as that of the first insulating film.

(19) A semiconductor integrated circuit arrangement fabrication method of the present invention comprises the following steps (a) to (d):

(a) forming a MISFET on a main surface of a semiconductor substrate, (b) depositing a first insulating film on the whole surface of the semiconductor substrate and thereafter depositing a second insulating film at an etching rate different from that of the first insulating film on the first insulating film, (c) selectively producing dissociated species for maximizing the selection ratio of the second insulating film to the first insulating film by allowing an inert gas excited to a metastable state in a plasma and a flon gas to interact with each other and etching the second insulating film by using the dissociated species, and (d) selectively producing dissociated species for maximizing the selection ratio of the first insulating film to the semiconductor substrate by allowing an inert gas excited to a metastable state in a plasma and a flon gas to interact with each other, and making a contact hole connected to the semiconductor substrate between the gate electrode of the MISFET and that of a MISFET adjacent to the former MISFET and locally overlapped with the gate electrodes by etching the first insulating film with the dissociated species.

(20) In a semiconductor integrated circuit arrangement fabrication method of the present invention according to the method (19), the second insulating film is etched by using an inorganic material formed on the second insulating film as a mask.

(21) In a semiconductor integrated circuit arrangement fabrication method of the present invention according to the method (19), the diameter of the contact hole is 0.25 µm or less.

(22) In semiconductor integrated circuit arrangement fabrication method of the present invention according to the method (20), the mask made of the inorganic material is formed from the same material as that of the first insulating film.

An inert gas is excited to a metastable state whose transition to the ground state is inhibited by the interaction with a plasma. Because the spontaneous emission life under the metastable state (average time in which the metastable state naturally changes to the ground state) is on the order of one second, a lot of metastable-state inert gas can be present in a reaction chamber. The metastable-state inert gas releases energy due to collision and changes to the ground state. The released energy is uniform and therefore makes it possible to selectively excite reaction gas molecules.

The following is the description of actions of a rare gas which is a typical example of an inert gas. Table 1 shows the metastable level energies of rare gases (He, Ne, Ar, Kr, and Xe) (Note 1).

TABLE 1

Metastable level energies of rare gases

| Rare gas element | Metastable level energy (eV) | |
|---|---|---|
| He | 19.82 | 20.61 |
| Ne | 16.62 | 16.72 |
| Ar | 11.55 | 11.72 |
| Kr | 9.92 | 10.56 |
| Xe | 8.32 | 9.45 |

Note 1: J. S. Chang, R. M. Hobson, Yukimi Ichikawa, Teruo Kaneda, "DENRIKITAI NO GENSHI BUNSHI KATEI" p. 142 (TOKYO DENKI DAIGAKU SHUPPAN KYOKU, 1982).

As shown in Table 1, every rare gas is limited in the types of metastable states which can be used. Therefore, it is necessary that the antibonding orbitals of flon gas molecules to be introduced are present at places coinciding with the metastable level energy of a rare gas, and dissociated species from the antibonding orbital must be preferable to etching.

Moreover, it is necessary to know the adhesive property, etching property, and selectivity as the properties of dissociated species used for etching a silicon oxide film. Table 2 shows dissociated species belonging to respective properties.

TABLE 2

Properties and examples of dissociated species

| Property | Dissociated species |
|---|---|
| Adhesive property | $CF_2$, $C_2F_4$, $CH_2$, CHF, CF, CH |
| Etching property | $CF_2$, $C_2F_4$, $CF_3$, F, $CHF_2$, CF, CHF, $CF_{2+}$, $C_2F_{4+}$, $CF_{3+}$, $F_+$, $CHF_{2+}$, $CF_+$, $CHF_+$ |
| Selectivity (To Si) | $CH_2$, $C_2F_4$, $CHF_2$, CF, CHF, $CF_{2+}$, $C_2F_{4+}$, $CHF_{2+}$, $CF_+$, $CHF_+$ |
| Non-selectivity | $CF_3$, F, $CF_{3+}$, $F_+$ |
| Non-etching property | $CH_2$, HF, CH |
| Bombardment vertical to substrate | $CF_{2+}$, $C_2F_{4+}$, $CF_{3+}$, $F_+$, $CHF_{2+}$, $CF_+$, $CHF_+$, $CH_{2+}$, $CH_+$ |
| Bombardment isotropic to substrate | $CF_2$, $C_2F_4$, $CF_3$, F, $CHF_2$, CF, CHF, $CH_2$, CH |

To improve the selection ratio, it is necessary to remove non-selective dissociated species. Moreover, to keep the etching shape accuracy, it is necessary to use dissociated species having a selectivity and an adhesive property. From the properties in Table 2, it will be understood that the dissociated species in the row of non-selectivity are preferable. The etching rate can be obtained by ordinary system control such as controlling the introduced amount of reaction gases, mixing ratio of the reaction gases, and the power.

Dissociation from an antibonding orbital can be known by molecular orbital calculation (Note 2). The calculation accuracy can be evaluated by calculating the metastable state of a rare gas and the known reactions of molecules. Table 3 shows measurement results (Note 3) and calculation results of reactions of monosilane ($SiH_4$).

TABLE 3

Calculation result of resonance dissociation of $SiH_4$

| Gas | Measured metastable level energy | Calculated excitation energy of molecule | Calculated transition route | Dissociated species (Coincides with measurement result.) |
|---|---|---|---|---|
| He | 21.2 eV | 21.2 eV (Semi-bonding orbital) | None | $SiHx_+$ Si* |
| Ar | 11.7 eV | 12.2 eV (Non-antibonding orbital) | Transition from 8.6- to 8.8-eV antibonding orbital | SiHx SiH* Si* |

Note 2: K. Kobayashi, N. Kurita, H. Kumahora, and K. Tago, Phs. Rev. B45, 11299 (1992); K. Kobayashi, N. Kurita, H. Kumahora, and K. Tago, Phys. Rev. A43, 5810 (1991); K. Tago, H. Kumahora, N. Sadaoka, and K. Kobayashi, Int. J. S. Supercomp. Appl. 2, (1988) 58.

Note 3: M. Tsuji, K. Kobayashi, S. Yamaguchi, and Y. Nishimura, Che. Phys. Lett. 158, 470 (1989).

From Table 3, it will be understood that the energy of the antibonding orbital of a molecule can be measured at an accuracy of within 1 eV by molecular orbital calculation.

Moreover, by the molecular-orbit calculation, it is possible to know molecules to be selected to produce dissociated species shown in the box of "Selectivity" in Table 2. From the calculation for dissociated species and molecules for producing the species shown in Table 3, it will be understood that the energy necessary for neutral dissociation is 2 eV or more, the minimum energy necessary for excitation to the antibonding orbital is 5 to 12 eV, and the ionization potential of a dissociated species is 10 to 13 eV.

From the above facts, it will be further understood that the energy necessary for ionic dissociation is 12 eV or more. Therefore, selective production of ionic and neutral dissociated species can be expected from He and Ne and selective neutral dissociation of Ar, Kr, and Xe can be expected.

Moreover, by examining the dissociation from the antibonding orbital through the molecular orbital calculation, it is possible to examine whether or not an antibonding orbital from which the selective dissociated species are produced in Table 2 is present in each molecule. Table 4 shows molecules in which the antibonding orbital is present and its excitation energy is close to the metastable level energy of a rare gas. Examined molecules are $CF_4$, $CHF_3$, $C_2F_4$ and $C_4F_8$, of the out of flon gases.

TABLE 4

Flon gas molecule having antibonding orbital from which selective dissociation species are produced

| Rare gas | Selective dissociation species | Molecule having antibonding orbital from which non-selective dissociation species are not produced | Molecule having antibonding orbital from which non-selective dissociation species are produced |
|---|---|---|---|
| He | $CH_{2+}$ $C_2F_{4+}$ $CHF_{2+}$ $CF_2$ $C_2F_4$ | $C_2F_4$, $CH_2F_2$ $C_4F_8$ $CH_2F_2$ $C_2F_4$ $C_4F_8$ | |

TABLE 4-continued

Flon gas molecule having antibonding orbital from which selective dissociation species are produced

| Rare gas | Selective dissociation species | Molecule having antibonding orbital from which non-selective dissociation species are not produced | Molecule having antibonding orbital from which non-selective dissociation species are produced |
|---|---|---|---|
| Ne | $CF_{2+}$ $C_2F_{4+}$ $CHF_{2+}$ $CF_2$ $C_2F_4$ CHF | $C_2F_4$ $CH_2F_2$ $C_2F_4, CH_2F_2$ | $C_4F_8$ (Transition from non-antibonding orbital) $CHF_3$ $C_4H_8$ (Same as the above) $C_4F_8$ (Same as the above) $CHF_3$ |
| Ar | $CF_2$ $CHF_2$ CHF | $C_2F_4, C_4F_8$ | $CHF_3, CF_4$ $CHF_3$ $CHF_3$ |
| Kr | $CF_2$ $C_2F_4$ $CHF_2$ CHF | $CH_2F_2$ $C_4F_8$ $CH_2F_2$ $CH_2F_2$ | $CF_4$ $CH_3$ |
| Xe | $CF_2$ $C_2F_4$ | $CH_2F_2$ $C_4F_8$ | $CH_2F_2$ |

When using selective dissociation due to interaction with a metastable-state rare gas, dissociation due to electrons in a plasma is also slightly present. Moreover, in the case of an actual etching process, there is a possibility that non-selective dissociation species are expelled due to ion incidence. Therefore, it may be necessary to mix adhesive CHF or CF with a small etching rate in order to protect a side wall. In this case, it is necessary to use the selective dissociation from $CH_2F_2$.

Moreover, when using the protective dissociation species together, preferable etching is also realized by using the selective dissociation of $CHF_3$ from which production of non-selective dissociation species is relatively small. However, because $CF_4$ produces a lot of non-selective dissociation species, it is necessary to increase the amount of protective gas when combining $CHF_3$ with $CF_4$.

Furthermore, even if the etching method of the present invention using selective dissociation is combined with a conventional etching method not using the selective dissociation due to interaction with a metastable-state rare gas or an etching method using selective dissociation by which a lot of non-selective dissociation species are produced, a preferable result is obtained because it is possible to control the ratio of dissociation species by the mixing ratio.

When using the selective dissociation due to interaction with a metastable-state rare gas by controlling the dissociation by electrons in a plasma, it is necessary to spatially separate a rare-gas plasma chamber from an introduced-gas dissociation reaction chamber. Because it is possible to introduce positive ions and an electrically-neutral metastable-state rare gas into the dissociation reaction chamber by partitioning the two chambers by a grid, selective dissociation and ion assisted etching are realized.

DESCRIPTION OF THE PREFERRED EMBODIMENTS

Embodiments of the present invention will BE described below in detail referring to the accompanying drawings.

[Embodiment 1]

Figure 1:
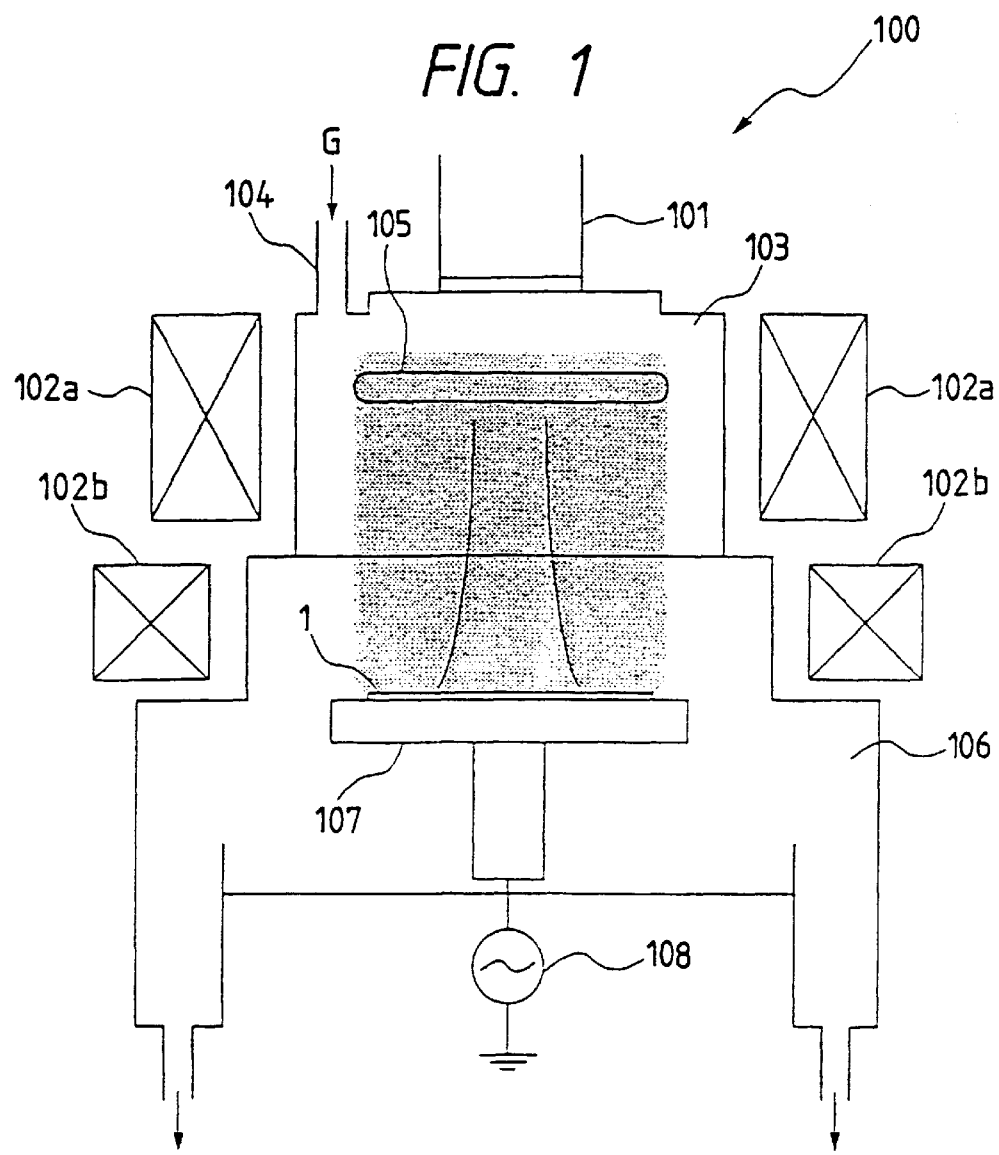
FIG. 1 is a schematic view of a microwave plasma etching system used in Embodiment 1 of the present invention

FIG. 1 is a schematic view of a microwave plasma etching system 100 used in this embodiment. The system 100 includes a microwave guide 101, magnets 102a and 102b, a plasma generation change 103, and a a reaction chamber 106. Microwaves of 2.45 GHz generated by a magnetron are introduced into the plasma generation chamber 103 through the microwave guide 101. Moreover, a material gas G is introduced into the plasma generation chamber 103 through a gas introduction port 104.

By introducing microwaves into the plasma generation chamber 103 and generating a magnetic field of approx. 1 KG by the magnets 102a and 102b, the material gas G is transformed into a plasma by electron cyclotron resonance at an ECR position 105 with a flux density of approx. 875 G.

In this case, neutral dissociated species and ionic dissociated species generated from the material gas G are transferred to the surface of a semiconductor substrate (wafer) 1 in the reaction chamber 106. A susceptor 107 for supporting the semiconductor substrate 1 is connected to a radio-frequency power supply 108 which applies a radio frequency to the semiconductor substrate 1 to generate a self-bias and control the ion energy.

The following is the description of the etching process of this embodiment using the microwave plasma etching system 100. This is a process widely used as an element isolation technique for making a connection hole in an insulating film in order to make contact with a silicon substrate adjacent to a field insulating film of a LOCOS (Local Oxidation of Silicon) structure.

Conventionally, it has been necessary to make such a connection hole so that it does not overlap with a field insulating film. This is because the substrate is exposed and the element isolation property of the field insulating film is deteriorated if the base field insulating film is removed due to overetching when making the connection hole by dry-etching the insulating film.

In the case of a layout design that does not allow the overlap between the connection hole and the insulating film, it is difficult to realize an LSI with a design rule of approx. 0.3 μm or less because of restrictions by the mask alignment accuracy of the photolithography process or the like.

Figure 2:
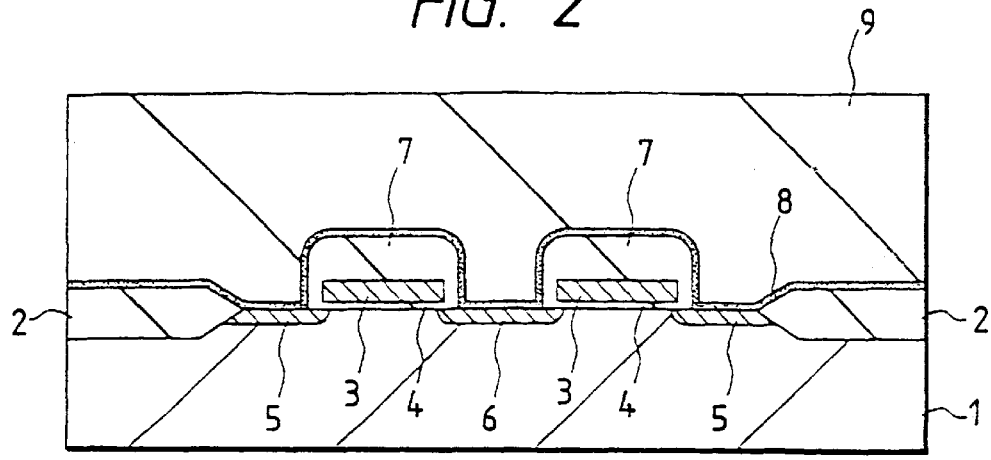
FIGS. 2–6 are sectional views of an essential portion of a semiconductor substrate, showing Embodiment 1 of a semiconductor integrated circuit arrangement fabrication method of the present invention.

Therefore, in the case of this embodiment, as shown in FIG. 2, a field insulating film 2 of the LOCOS structure is formed on a main surface of the single-crystalline silicon semiconductor substrate 1, and then a semiconductor device such as a MISFET is formed in an active region enclosed by the field insulating film 2 by an ordinary method.

The MISFET comprises a gate electrode 3 made of a polysilicon film, a gate insulating film 4 made of a silicon oxide film, and a pair of semiconductor regions (source region and drain region) 5, 6 formed on the semiconductor substrate 1. Moreover, the top and side walls of the gate electrode 3 are protected by a silicon oxide film 7.

Then, a silicon nitride film 8 with a thickness of 500 to 2,000 Å is deposited on the whole surface of the semiconductor substrate 1 by a CVD process and moreover, a BPSG (Boro Phospho Silicate Glass) film 9 with a thickness of 5,000 to 10,000 Å is deposited on the film 8 by a CVD process.

Figure 3:
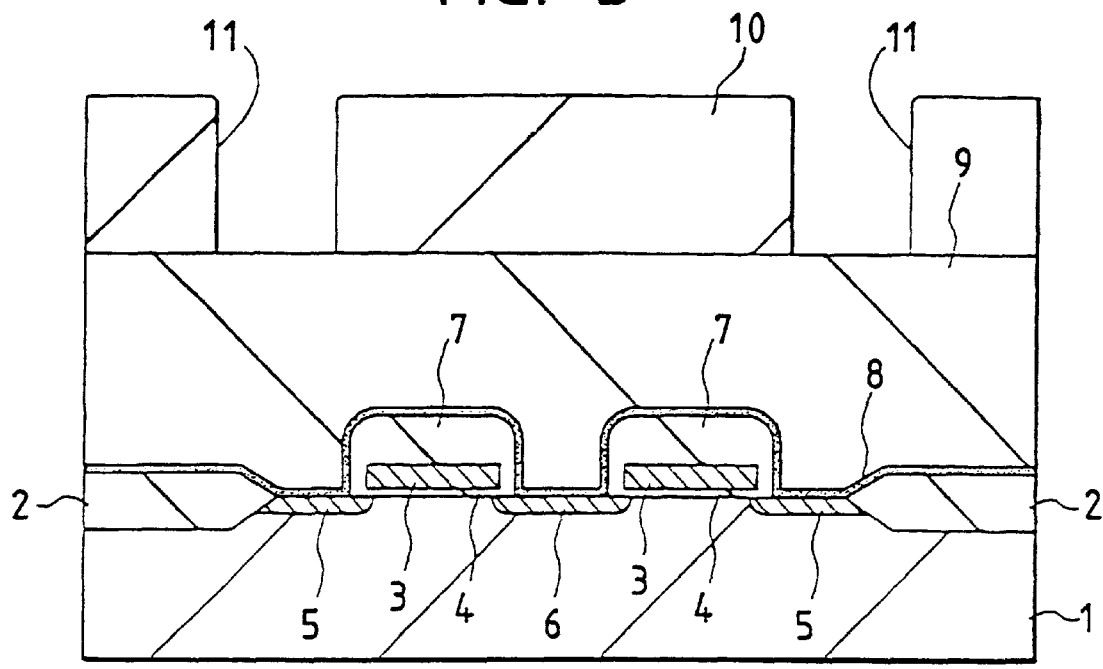

Then, as shown in FIG. 3, a photoresist pattern 10 is formed on the BPSG film 9. The photoresist pattern 10 has an opening 11 above the one semiconductor region 5 of the MISFET. The opening 11 is so made that one end of the opening 11 overlaps with the field insulating film 2 adjacent to the semiconductor region 5.

Then, the semiconductor substrate 1 is loaded into the reaction chamber 106 of the microwave plasma etching system 100 to dry-etch the BPSG film 9 by using the photoresist pattern 10 as a mask. This etching is so performed that the selection ratio of the BPSG film 9 to the base silicon nitride film 8 is maximized. That is, the material gas G is made of a mixture gas of a flon reaction gas and an inert gas shown in Table 5, and the proportion of the inert gas is set to 80% or more of the total amount of the mixture gas. Moreover, in this case, the processing pressure is set to 100 to 500 mTorr.

TABLE 5

Conditions of etching BPSG layer and increasing selection ratio to $Si_3N_4$

| Reaction gas (Flon gas) | Inert gas |
| --- | --- |
| $C_4F_8$ | He, Ar, Kr, Xe |
| $C_2F_4$ | He, Ne, Ar |

Figure 4:
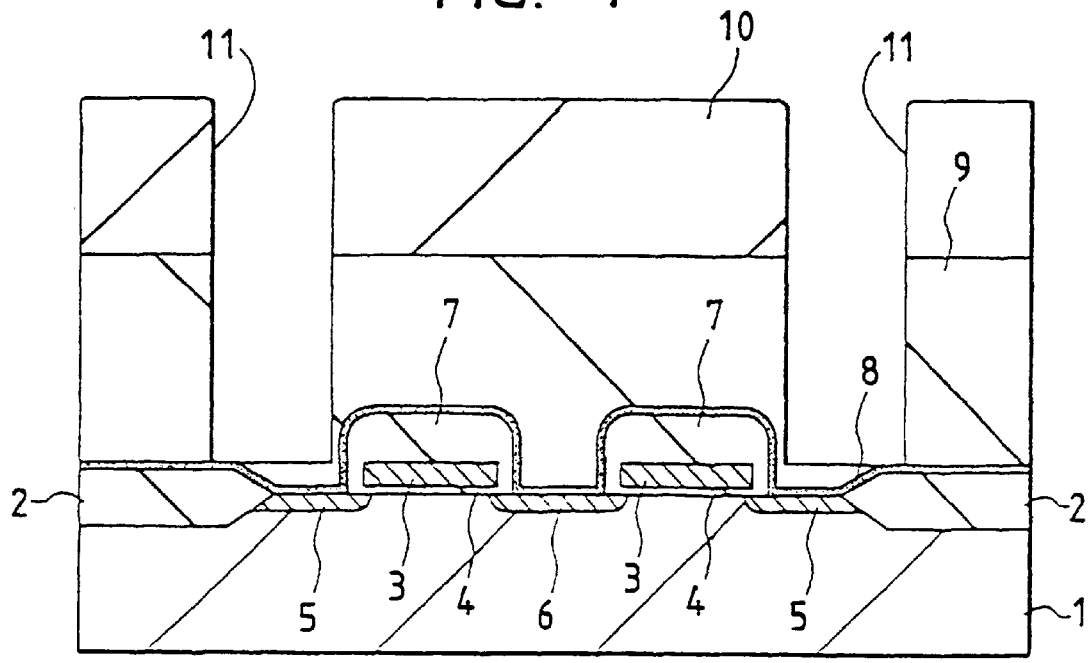

FIG. 4 shows a state that the etching of the BPSG film progresses halfway and the silicon nitride film 8 on the field insulating film 2 is exposed from the bottom of the opening 11.

Figure 5:
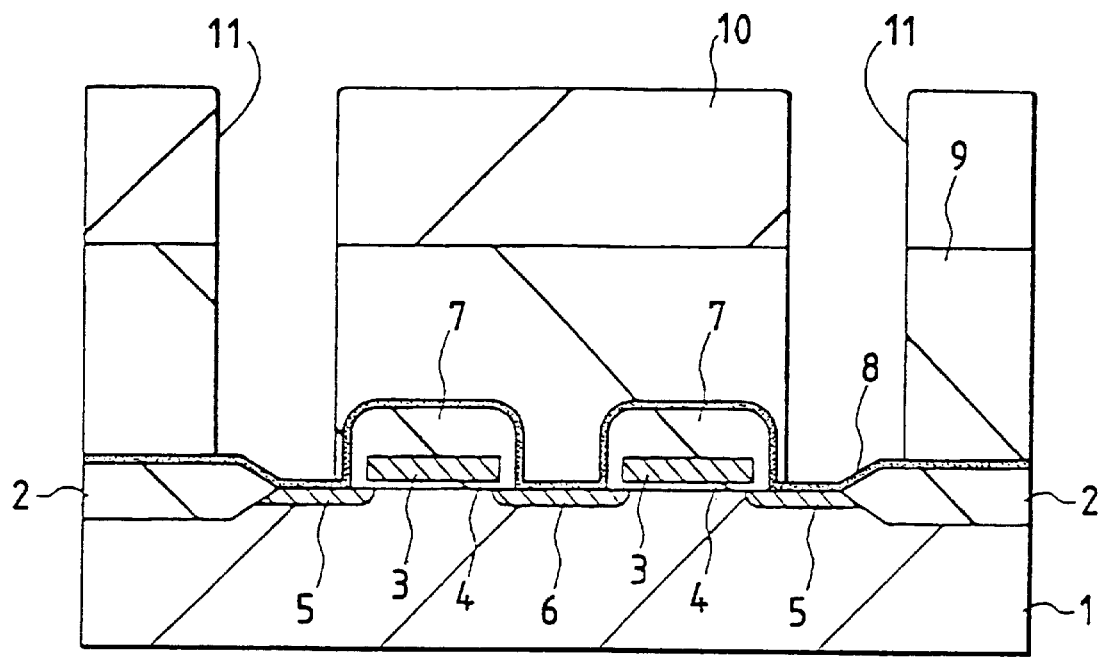

FIG. 5 shows a state that the etching of the BPSG film 9 ends. In the case of this embodiment, because the BPSG film 9 is etched under the condition that the selection ratio to the silicon nitride film 8 is maximized, the silicon nitride film 8 serves as a stopper of etching and it is possible to prevent the field insulating film 2 from being removed even if adequate overetching is performed.

Figure 6:
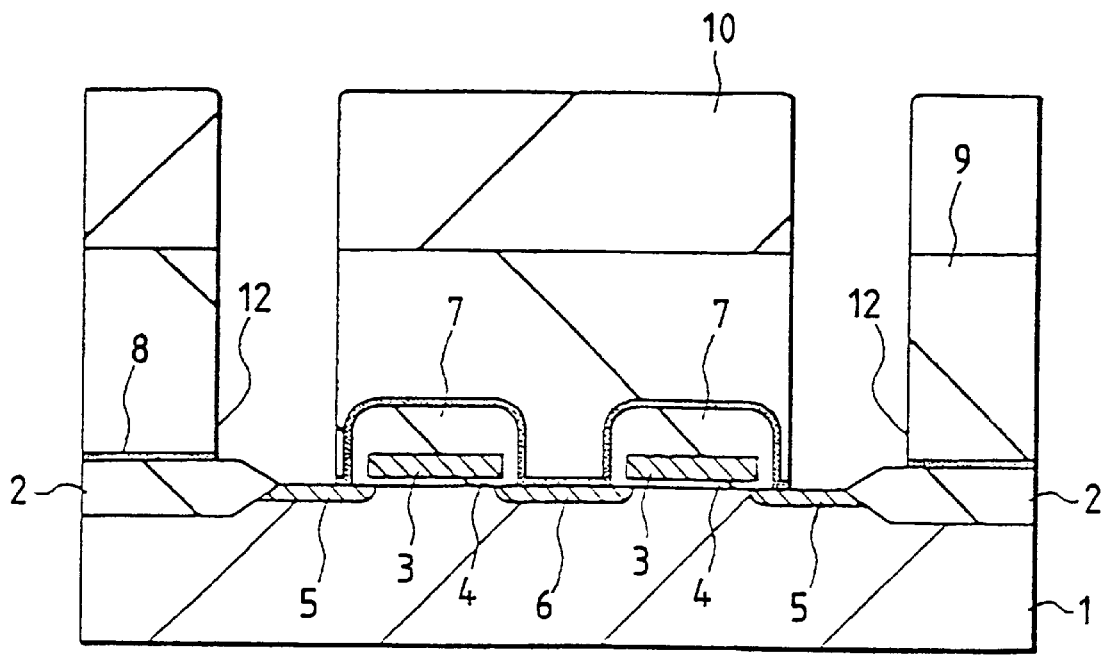

FIG. 6 shows a state that a connection hole 12 reaching the semiconductor region 5 of the MISFET is completed by removing the residual silicon nitride film 8 through etching.

The silicon nitride film 8 is etched by the microwave plasma etching system 100 under the condition that the selection ratio of the silicon nitride film 8 to the base semiconductor substrate 1 is maximized. That is, the material gas G is made of a mixture gas of a flon reaction gas and an inert gas shown in Table 6, and the proportion of the inert gas is set to 80% or more of the total amount of the mixture gas. Moreover, in this case, the processing pressure is set to 100 to 500 mTorr.

TABLE 6

Conditions of etching $Si_3N_4$ layer and increasing selection ratio to Si

| Reaction gas (Flon gas) | Inert gas |
| --- | --- |
| $CH_2F_2$ | He, Ar, Kr, Xe |

Therefore, this embodiment makes it possible to make the connection hole 12 locally overlapping with the field insulating film 2 without removing the field insulating film 2, and thereby realize an LSI with a design rule of 0.3 $\mu$m or less.

[Embodiment 2]

Figure 7:
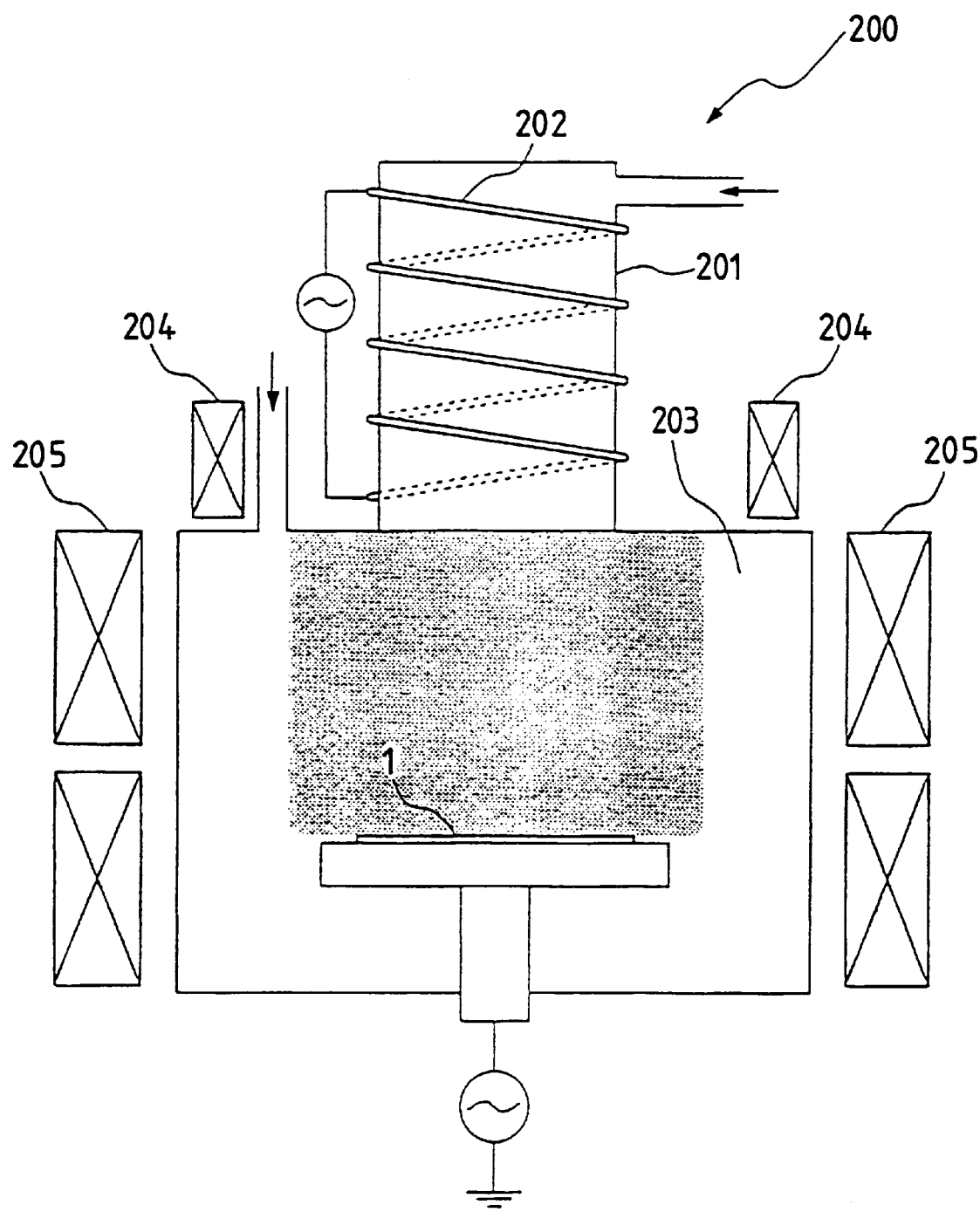
FIG. 7 is a schematic view of a plasma etching system used in Embodiment 2 of the present invention.

FIG. 7 is a schematic view of a plasma etching system 200 used in this embodiment. The plasma etching system 200 is provided with an antenna 202 around a quartz cylinder 201 so as to introduce electromagnetic waves into the cylinder 201 by applying a radio frequency to the antenna 202. Double coils 204 and 205 are provided to the outside of a vacuum chamber 203 so as to generate a magnetic field in the axial direction. A material gas G introduced through a gas introduction port 206 is transformed into a plasma by the axis-directional magnetic field and the radio frequency, and neutral dissociated species and ionic species generated during this time are transferred to the surface of the semiconductor substrate 1 where etching is performed.

Embodiment 1 uses the photoresist pattern 10 as a mask for etching the BPSG film 9. In this case, however, the products produced when photoresist is etched have an influence on the selectivity that must be considered. That is, it is necessary to determine the photoresist material and the etching condition which prevent the products produced by the etching from producing non-selective species.

Figure 8:
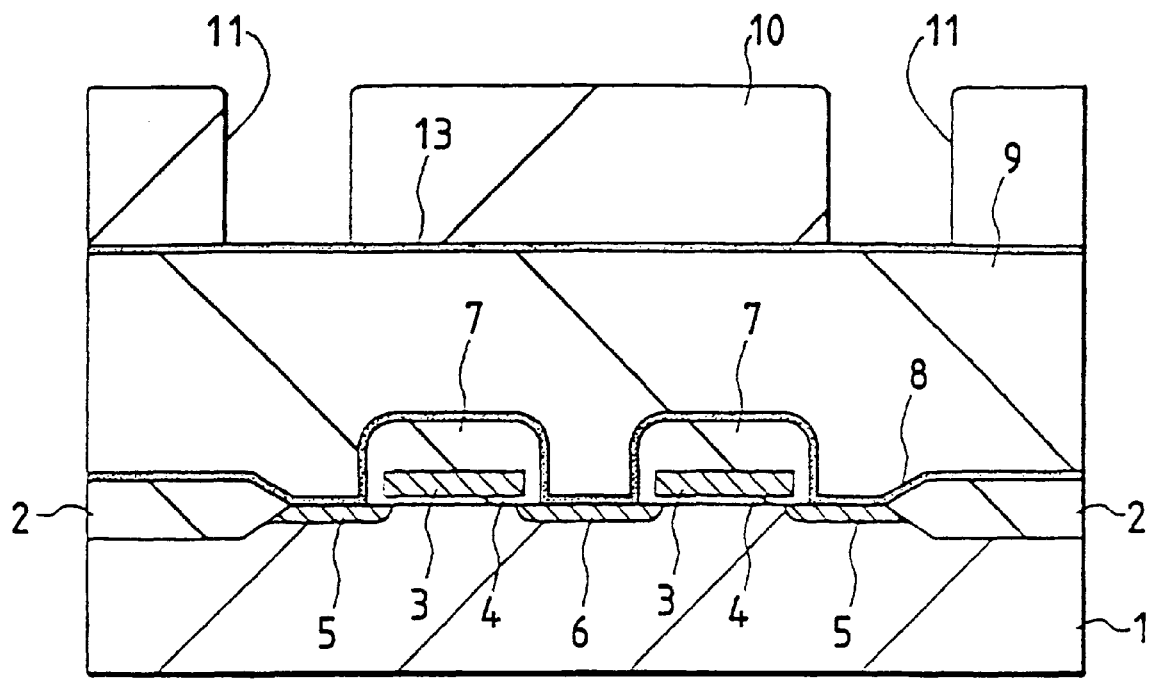
FIGS. 8–12 are sectional views of an essential portion of a semiconductor substrate, showing Embodiment 2 of a semiconductor integrated circuit arrangement fabrication method of the present invention.

Therefore, in this embodiment, a silicon nitride film 13 with a thickness of 500 to 2,000 Å is deposited on a BPSG film 9 by a CVD process before forming a photoresist pattern 10 on the silicon nitride film 13 as shown in FIG. 8. The photoresist pattern 10 has an opening 11 above one semiconductor region 5 of a MISFET, such that one end of the opening 11 overlaps with a field insulating film 2 adjacent to the semiconductor region 5.

Figure 9:
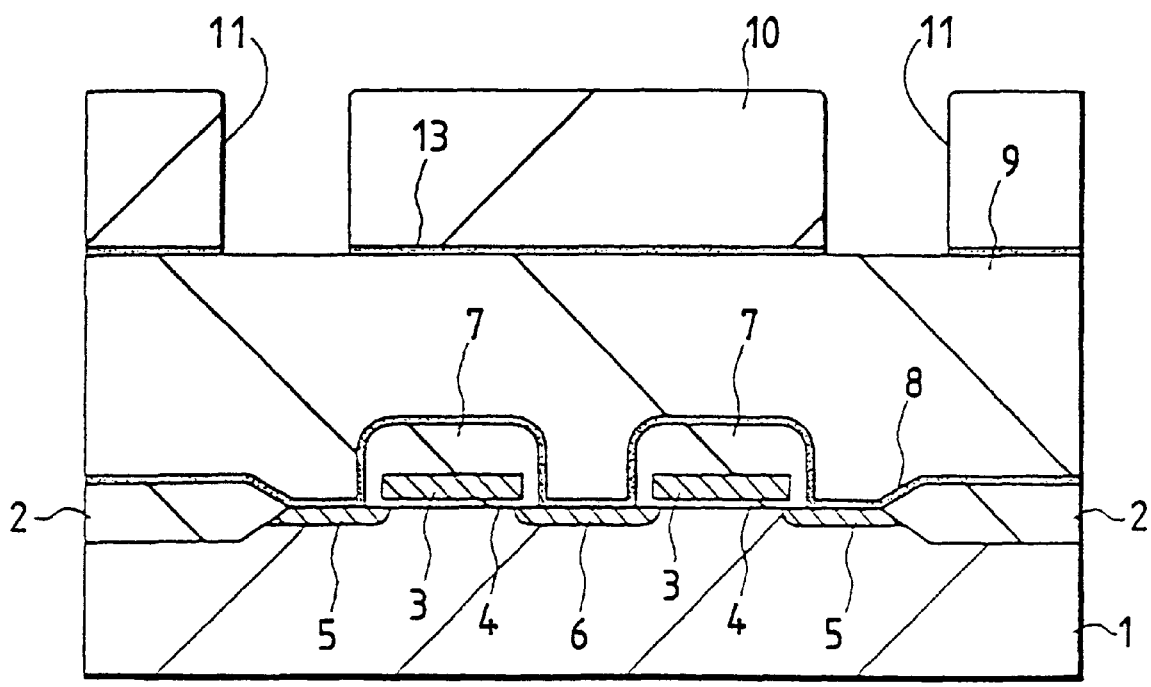

Then, as shown in FIG. 9, the silicon nitride film 13 is etched under a general etching condition by using the photoresist pattern 10 as a mask.

Then, the photoresist pattern 10 is removed by ashing and thereafter the BPSG film 9 is dry-etched by using the silicon nitride film 13 as a mask. This etching is performed under a condition that the selection ratio of the BPSG film 9 to the silicon nitride film 13 (and the silicon nitride film 8) is maximized. That is, the etching is performed by using a mixture gas of a flon reaction gas and an inert gas shown in Table 7, setting the content of the inert gas to 80% or more of the total amount of the mixture gas, and setting the processing pressure to 100 to 500 mTorr.

TABLE 7

Conditions of etching BPSG layer and increasing selection ratio to $Si_3N_4$

| Reaction gas | Inert gas |
|---|---|
| $C_4F_8$ | He, Ar, Kr, Xe |
| $C_2F_4$ | He, Ne, Ar |

Figure 10:
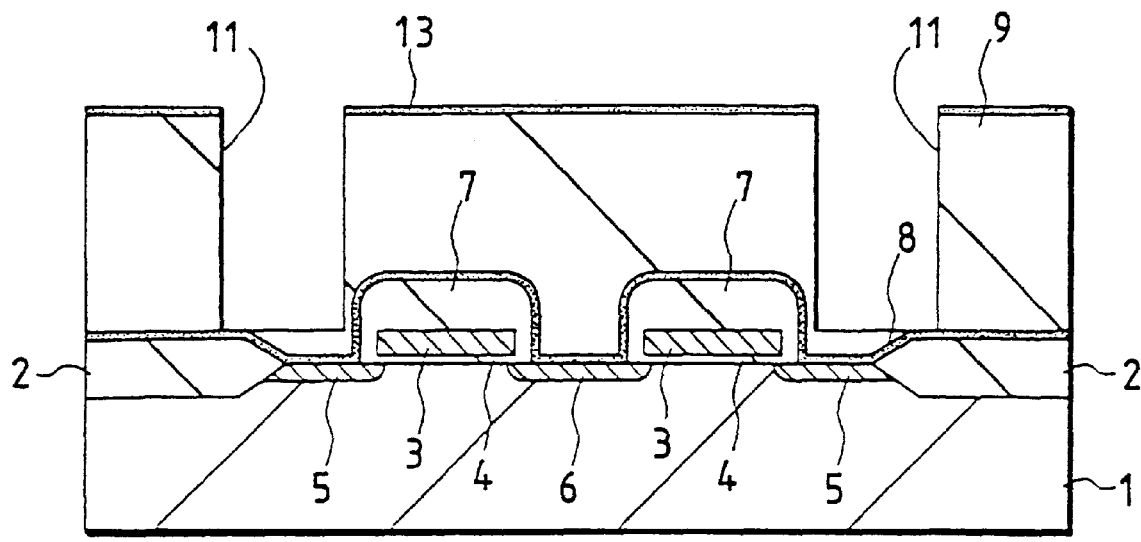

FIG. 10 shows a state that the etching of the BPSG film 9 progresses halfway and the silicon nitride film 8 on the field insulating film 2 is exposed from the bottom of the opening 11.

Figure 11:
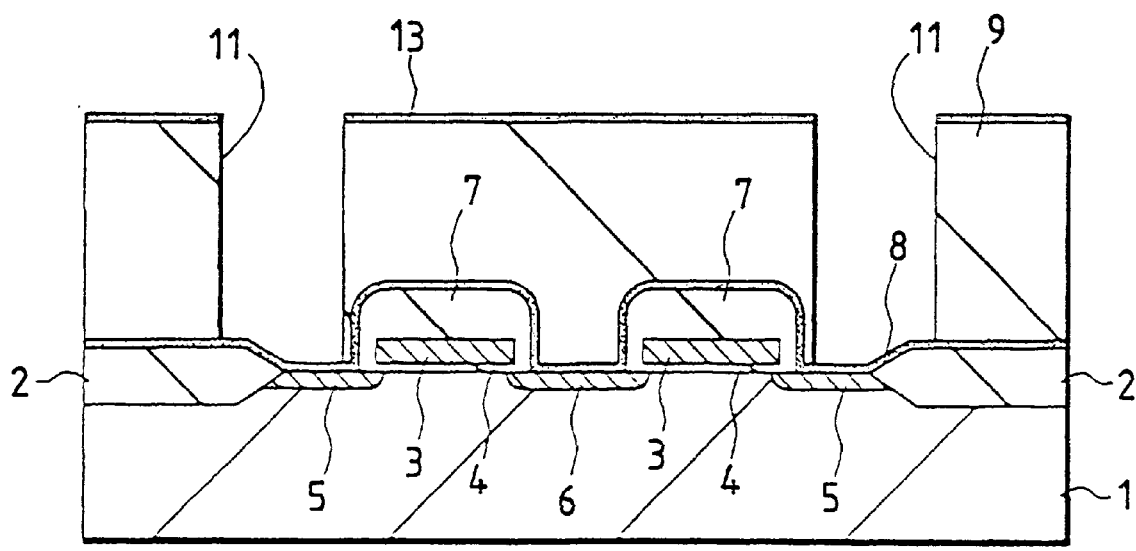

FIG. 11 shows a state that the etching of the BPSG film 9 ends. Because the BPSG film 9 is etched under the condition that the selection ratio to the silicon nitride film 8 is maximized, the silicon nitride film 8 serves as a stopper of the etching, and it is possible to prevent the field insulating film 2 from being removed even if sufficient overetching is performed.

Figure 12:
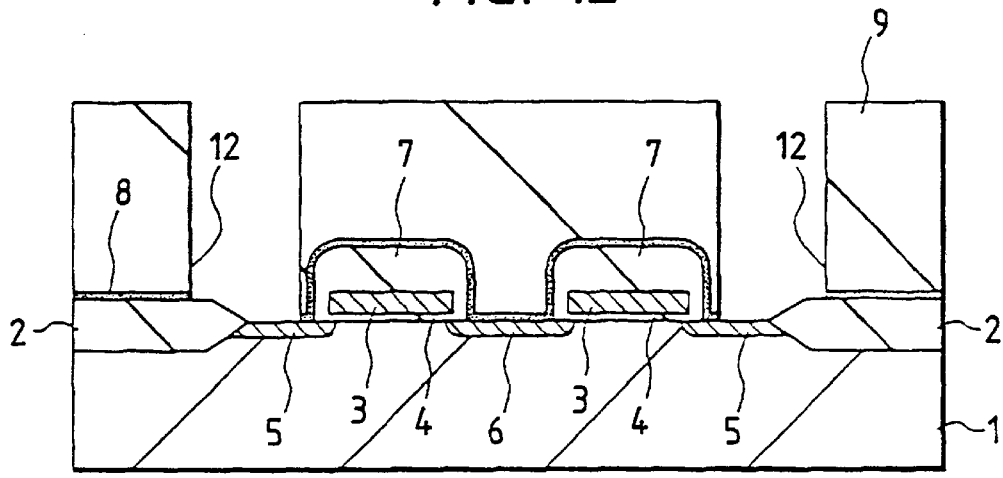

FIG. 12 shows a state that a connection hole 12 reaching the semiconductor region 5 of the MISFET is completed by removing the residual silicon nitride films 8 and 13 through etching.

The silicon nitride films 8 and 13 are etched under the condition that the selection ratio of the silicon nitride films 8 and 13 to the base semiconductor substrate 1 is maximized by using the plasma etching system 200. That is, the material gas G is made of a mixture gas of a flon reaction gas and an inert gas shown in Table 8 and the proportion of the inert gas is set to 80% or more of the total amount of the mixture gas. Moreover, in this case, the processing pressure is set to 100 to 500 mtorr.

TABLE 8

Conditions of etching $Si_3N_4$ layer and increasing selection ratio to Si

| Reaction gas | Inert gas |
|---|---|
| $CH_2F_2$ | He, Ar, Kr, Xe |

Therefore, in this embodiment using no photoresist for the mask for etching the BPSG film 9, the influence on selectivity due to the products produced when the photoresist is etched is eliminated, and thereby the etching selectivity is further improved.

[Embodiment 3]

Figure 13:
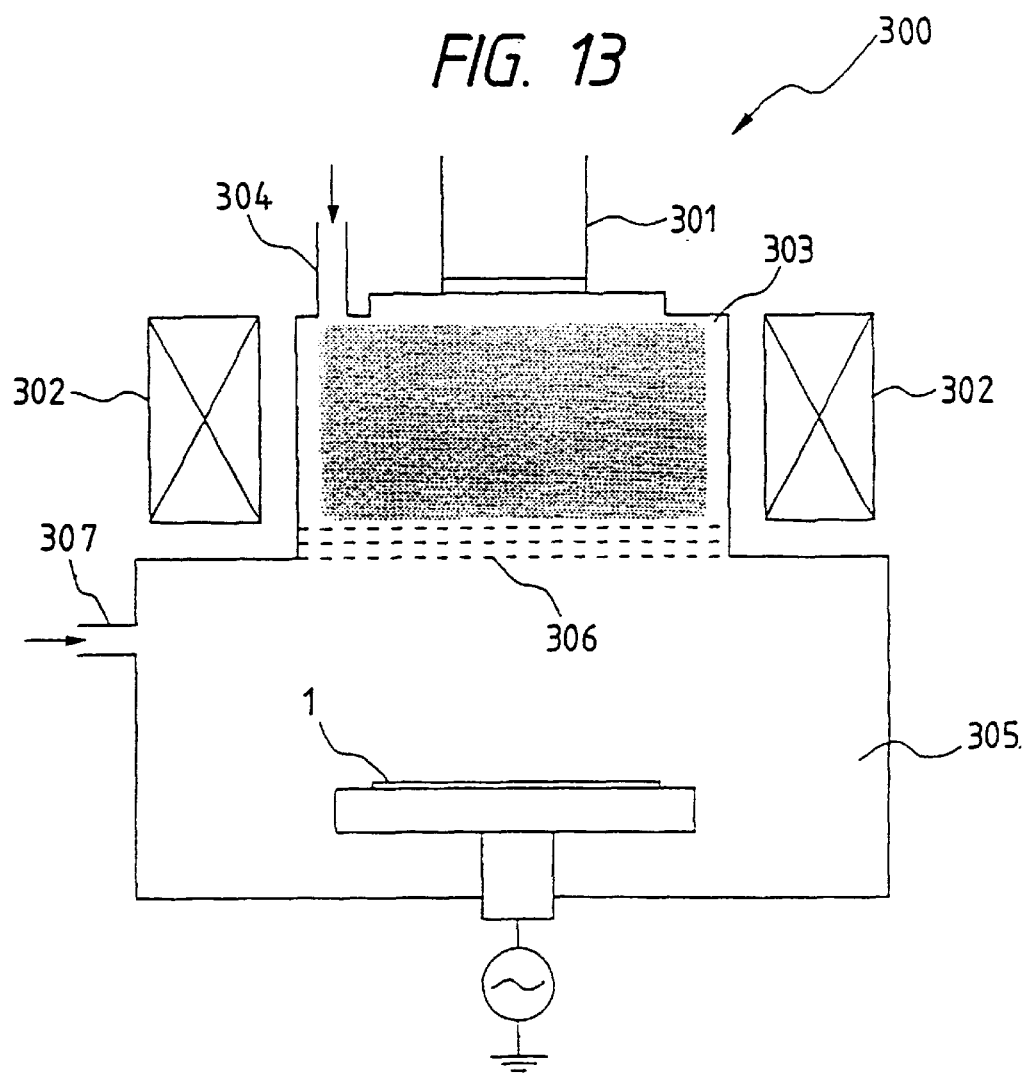
FIG. 13 is a schematic view of a microwave plasma etching system used in Embodiment 3 of the present invention.

FIG. 13 is a schematic view of a microwave plasma etching system 300 used in this embodiment. The system 300 includes a microwave guide 301, a magnet 302, and a plasma generation chamber 303. Microwaves of 24.5 GHz generated by a magnetron are introduced into the plasma generation chamber 303 through the microwave guide 301.

A plasma of an inert gas introduced through a gas introduction port 304 is generated in the plasma generation chamber 303.

A plurality of grid electrodes 306 are provided along the boundary between the plasma generation chamber 303 and a reaction chamber 305 and only ions (i.e., not electrons) the plasma are introduced into the reaction chamber 305 by alternately changing the potentials of the grid electrodes 306 to positive and negative states. Metastable atoms of the inert gas is introduced into the reaction chamber 305 while diffusing isotropically because they are not influenced by an electric field.

A reaction gas is introduced into the reaction chamber 305 through a gas introduction port 307 and predetermined dissociated species are generated due to the interaction with the metastable atoms of the inert gas. Then, the dissociated species and the ions of the inert gas are transferred to the surface of the semiconductor substrate 1, and etching starts and progresses.

An etching process using the microwave plasma etching system will be described below. This is a processing of making a connection hole in an insulating film in order to make contact with a silicon substrate between two adjacent MISFET gate electrodes.

For example, though the space between gate electrodes is decreased up to approx. 0.25 μm, it is impossible to make a connection hole between the gate electrodes when the resolution of a photomask used to make the connection hole is approx. 0.3 μm.

Figure 14:
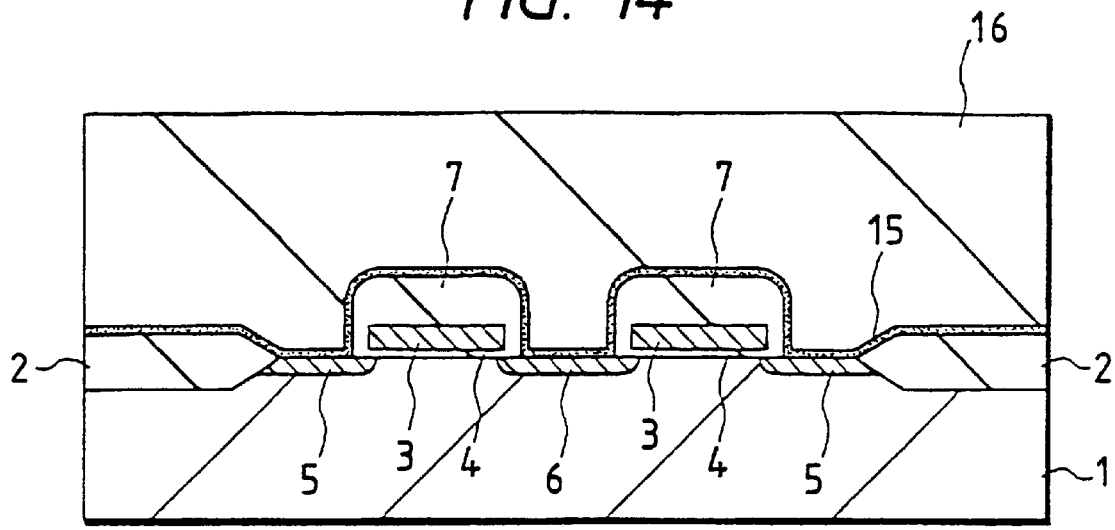
FIGS. 14–18 are sectional views of an essential portion of a semiconductor substrate, showing Embodiment 3 of the semiconductor integrated circuit arrangement fabrication method of the present invention.

Therefore, in this embodiment, a field insulating film 2 is formed on a main surface of a semiconductor substrate 1 and then a MISFET comprising a gate electrode 3, a gate insulating film 4, and a pair of semiconductor regions (source region and drain region) 5 and 6 are formed in an active region enclosed by the field insulating film 2 by an ordinary method as shown in FIG. 14. In this case, the space between adjacent gate electrodes 3 is approx. 0.25 μm. Moreover, the top and side wall of the gate electrodes 3 are protected by a silicon oxide film 7.

Then, a silicon nitride film 15 with a thickness of 500 to 2,000 Å is deposited on the whole surface of the semiconductor substrate 1 by a CVD process and moreover, a BPSG film 16 with a thickness of 5,000 to 10,000 Å is deposited on the film 15 by a CVD process.

Figure 15:
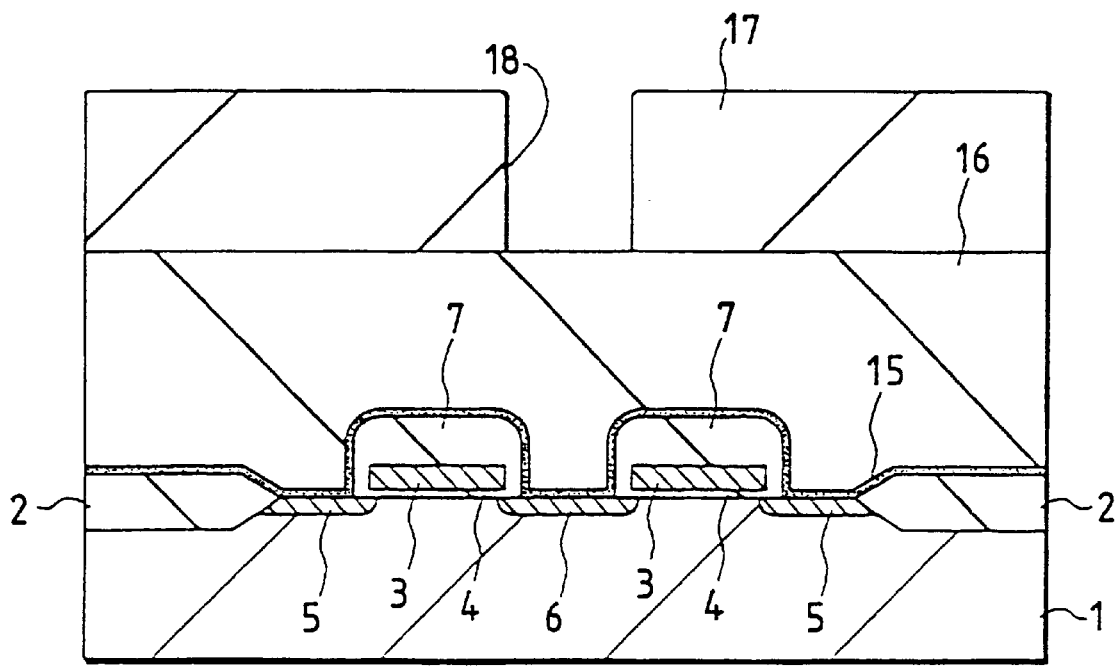

Then, as shown in FIG. 15, a photoresist pattern 17 is formed on the BPSG film 16. The photoresist pattern 17 has an opening 18 above one semiconductor region 6 of the MISFET. The opening 18 has a diameter of approx. 0.3 μm which is larger than the space (approx. 0.25 μm) between the gate electrodes 3. That is, the opening 18 is so provided that part of the opening 18 overlaps with the gate electrodes 3.

Then, the semiconductor substrate 1 is loaded into the reaction chamber 305 of the microwave plasma etching system 300 to dry-etch the BPSG film 16 by using the photoresist pattern 17 as a mask. This etching is so performed that the selection ratio of a BPSG film 16 to the base silicon nitride film 15 is maximized.

That is, the material gas G is made of a mixture gas of a flon reaction gas with an inert gas shown in Table 7, and the proportion of the inert gas is set to 80% or more of the total amount of the mixed gas. Moreover, in this case, the processing pressure is set to 100 to 500 mTorr.

Figure 16:
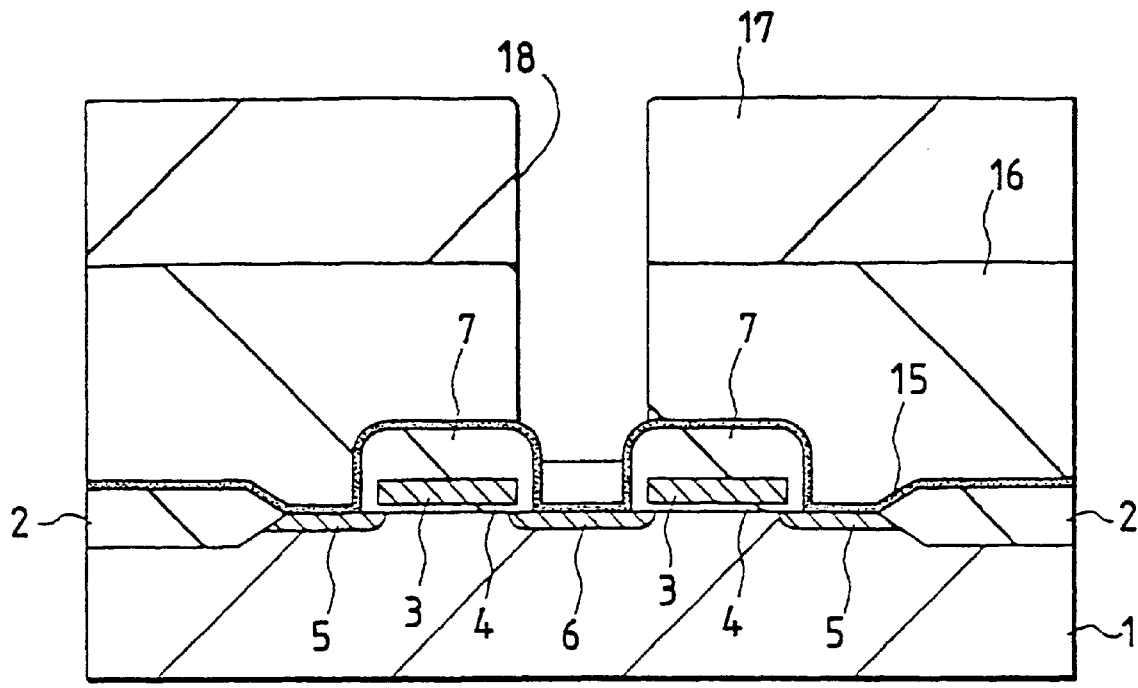

FIG. 16 shows a state that the etching of the BPSG film progresses halfway and the silicon nitride film 15 is exposed from the bottom of the opening 18.

Figure 17:
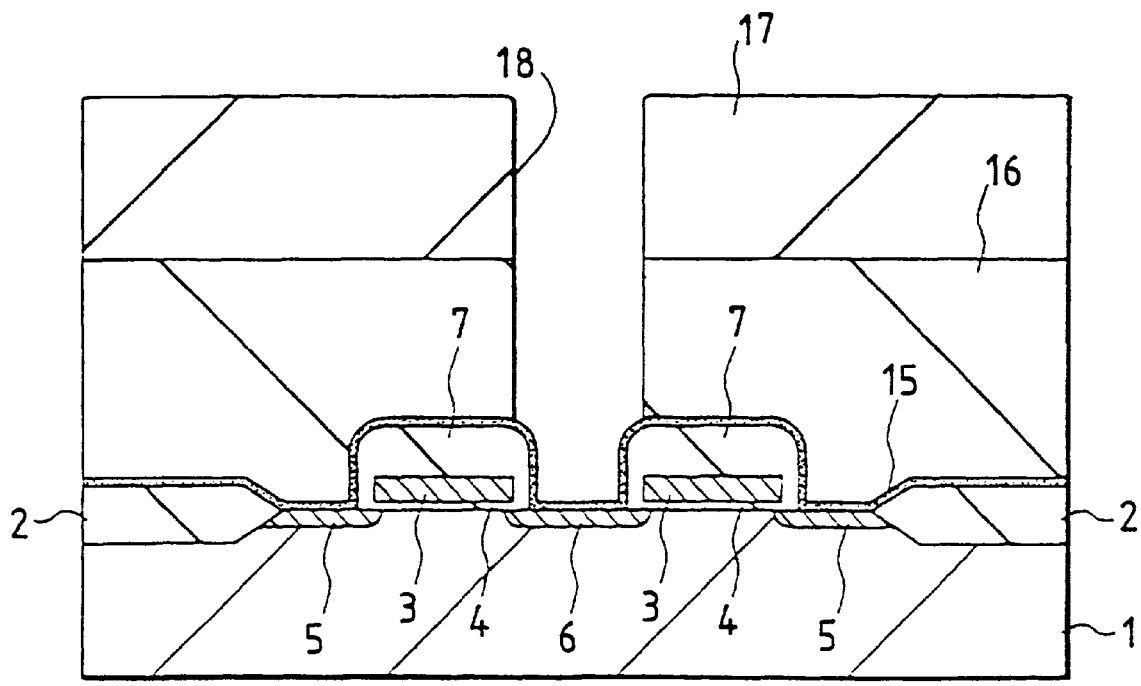

FIG. 17 shows a state that the etching of the BPSG film 16 ends. In this embodiment, because the BPSG film 16 is etched under the condition that the selection ratio to the silicon nitride film 15 is maximized, the silicon nitride film 15 serves as a stopper of the etching and resultingly, it is possible to prevent the silicon oxide film 7 for protecting the gate electrodes 3 from being removed even if sufficient overetching is performed.

Figure 18:
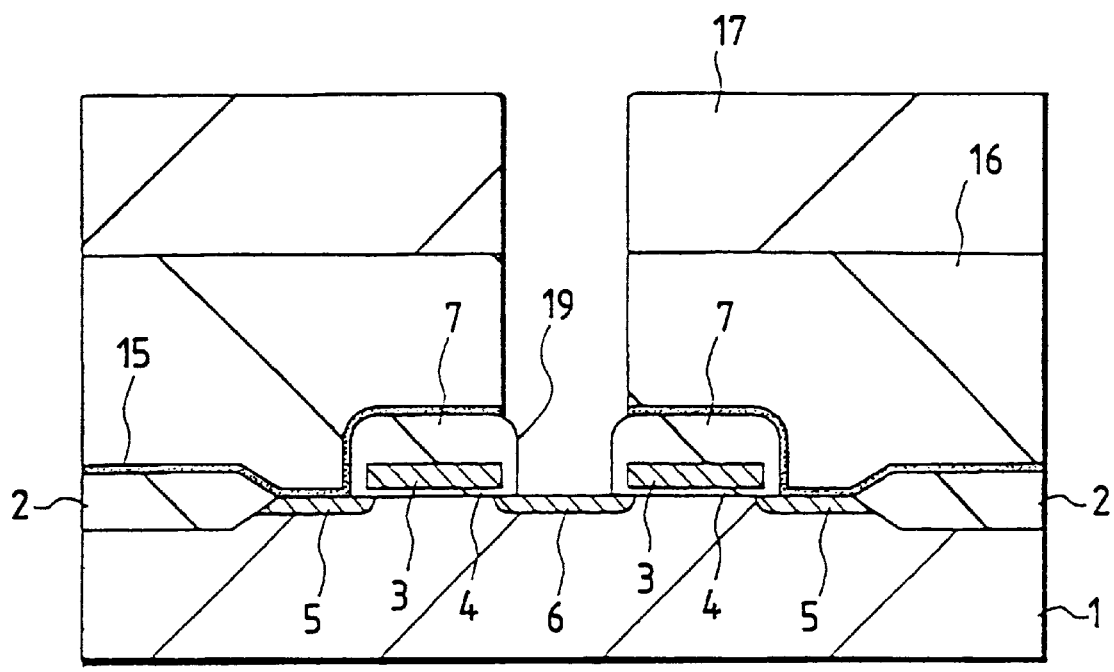

FIG. 18 shows a state that a connection hole 19 reaching the semiconductor region 6 of the MISFET is completed by removing the residual silicon nitride film 15 through etching. The silicon nitride film 15 is etched by the microwave plasma etching system 300 under the condition that the selection ratio of the silicon nitride film 15 to the base semiconductor substrate 1 is maximized. That is, the material gas G is made of a mixture gas of a flon reaction gas and an inert gas shown in Table 8, and the proportion of the inert gas is set to 80% or more of the total amount of the mixture gas. Moreover, in this case, the processing pressure is set to 100 to 500 mTorr.

As described above, by this embodiment, it is possible to realize an LSI with a space between the gate electrodes 3 of approx. 0.25 μm because it is possible to make the connection hole 19 overlapped with the gate electrodes 3 without removing the silicon oxide film 7 protecting the gate electrodes 3.

[Embodiment 4]

The above embodiment 3 uses the photoresist pattern 17 as a mask for etching the BPSG film 16. In this embodiment, however, it is necessary to select a photoresist material and etching conditions so as to prevent the products produced when photoresist is etched from producing non-selective dissociated species.

Figure 19:
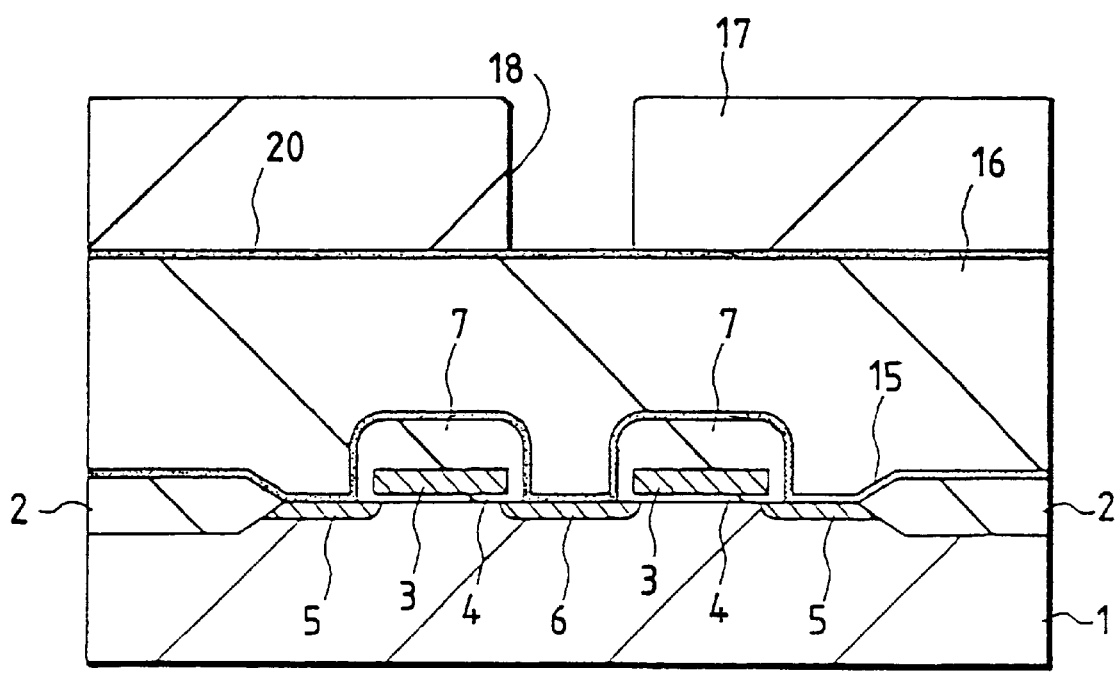
FIGS. 19–23 are sectional views of an essential portion of the semiconductor substrate, showing Embodiment 4 of a semiconductor integrated circuit arrangement fabrication method of the present invention.

Therefore, in this embodiment, a silicon nitride film 20 with a thickness of 500 to 2,000 Å is deposited on a BPSG film 16 by a CVD process to form a photoresist pattern 17 on the silicon nitride film 20 as shown in FIG. 19.

Figure 20:
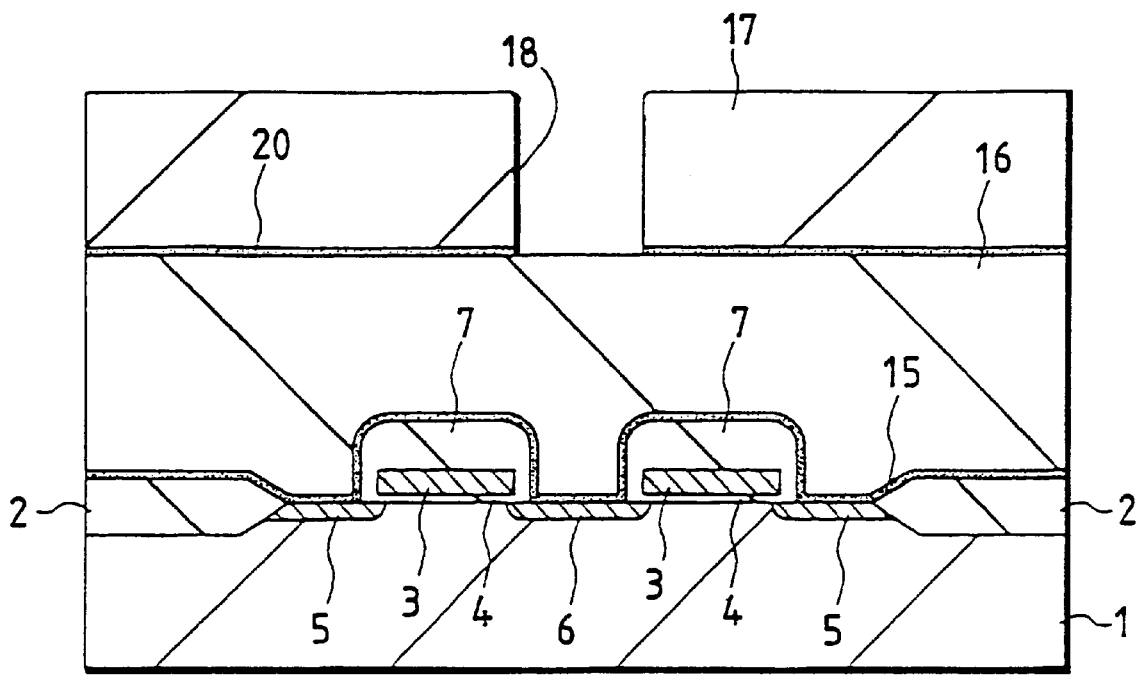

Then, as shown in FIG. 20, the silicon nitride film 20 is etched under ordinary etching conditions by using the photoresist pattern 17 as a mask.

Then, the photoresist pattern 17 is removed by ashing and thereafter the BPSG film 16 is dry-etched by using the silicon nitride film 20 as a mask. This etching is performed under the condition that the selection ratio of the BPSG film 16 to the silicon nitride film 20 (and the silicon nitride film 15) is maximized by using the microwave plasma etching system 300. That is, the etching is performed by using a mixture gas of a flon reaction gas and an inert gas shown in Table 7, and setting the proportion of the inert gas to 80% or more of the total amount of the mixture gas and the treatment pressure to 100 to 500 mTorr.

Figure 21:
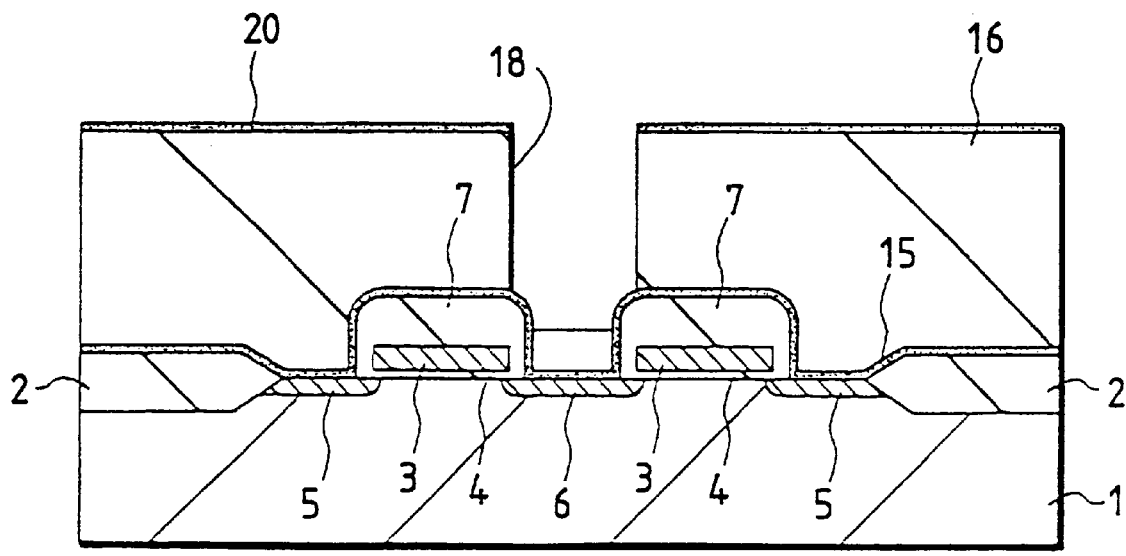

FIG. 21 shows a state that the etching of the BPSG film 16 progresses halfway and the silicon nitride film 15 is exposed from the bottom of the opening 18.

Figure 22:
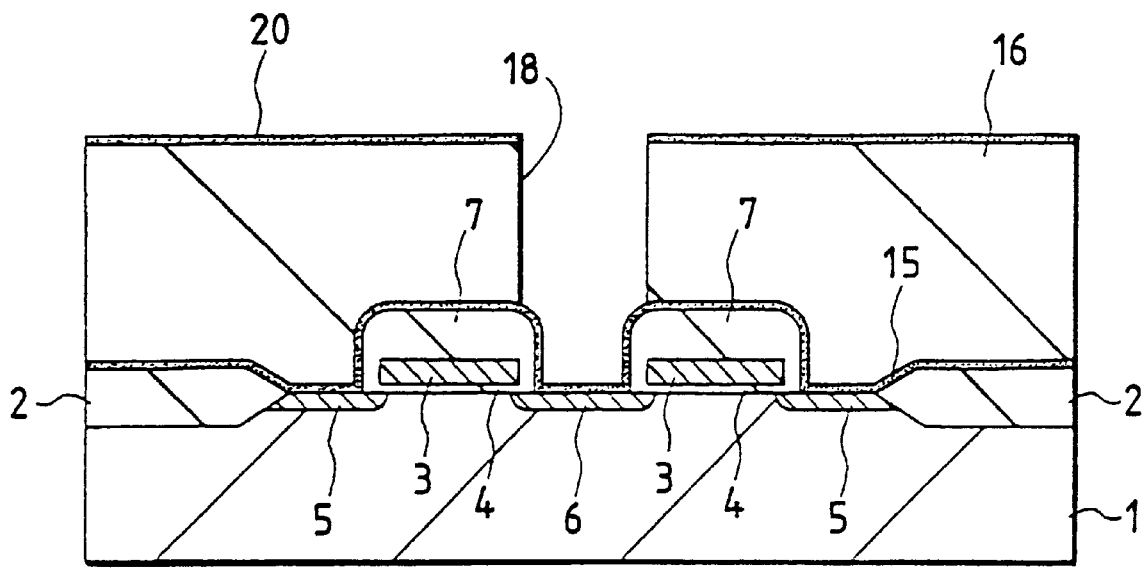

FIG. 22 shows a state that the etching of the BPSG film 16 ends. Because the BPSG film 16 is etched under the condition that the selection ratio to the silicon nitride film 15 is maximized, the silicon nitride film 15 serves as a stopper of the etching, and it is possible to prevent the silicon oxide film 7 for protecting the gate electrodes 3 from being removed even if sufficient overetching is performed.

Figure 23:
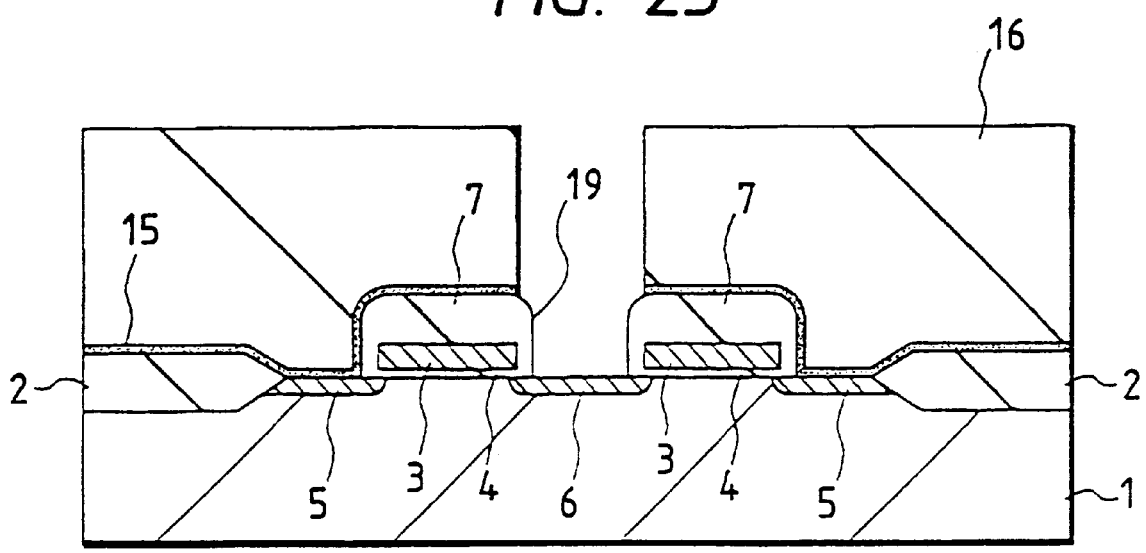

FIG. 23 shows a state that a connection hole 19 reaching the semiconductor region 6 of the MISFET is completed by removing the residual silicon nitride films 15 and 20 through etching. The silicon nitride film 15 is etched under the condition that the selection ratio of the silicon nitride film 15 to the base semiconductor substrate 1 is maximized by using the plasma etching system 300. That is, the material gas G is made of a mixture gas of a flon reaction gas and an inert gas shown in Table 8, and the proportion of the inert gas is set to 80% or more of the total amount of the mixture gas. Moreover, in this case, the processing pressure is set to 100 to 500 mTorr.

Thus, by this embodiment using no photoresist for the mask for etching the BPSG film 16, the influences of selectivity due to the products produced when the photoresist is etched are eliminated, and thereby the etching selectivity is further improved.

The present invention has been concretely described above by way of its preferred embodiment. However, the present invention is not restricted to embodiments, but various modifications of the present invention can be realized as long as they do not deviate from the gist of the present invention.

The reactive gases and inert gases used in the invention are not limited to the combinations of Embodiments 1 to 4. It should be noted that, for example, the combinations shown in Table 9 can be adopted.

TABLE 9

Classification of combinations of inert gases and reaction gas species according to properties of selective dissociated species

| Rare gas | Production of only selective dissociated species | Production of selective and protective dissociated species | Production of selective and non-selective dissociated species | |
| --- | --- | --- | --- | --- |
| | | | Small quantity | Large quantity |
| He | $C_2F_4$, $C_4F_8$ | $CH_2F_2$ | | |
| Ne | $C_2F_4$ | $CH_2F_2$ | $C_4F_8$, $CHF_3$ | |
| Ar | $C_2F_4$, $C_4F_8$ | | $CHF_3$ | $CF_4$ |
| Kr | $C_4F_8$ | $CH_2F_2$ | $CHF_3$ | $CF_4$ |
| Xe | $C_4F_8$ | $CH_2F_2$ | | |

The combinations of the reaction gases and the inert gases shown in the above Table 9 are grouped into the following:

A: Set of combinations of inert gases and reaction gas species producing only selective dissociated species;

B: Set of combinations of insert gases and reaction gas species producing selective and protective dissociated species;

C: Set of combinations of inert gases and reaction gas species producing selective dissociated species and a small quantity of non-selective dissociated species;

D: Set of combinations of inert gases and reaction gas species producing selective dissociated species and a large quantity of non-selective dissociated species; and E: Set of reaction gas species dissociated by a plasma.

The combinations of reaction gases and inert gases used in the present invention include elements of Set A and their combinations, combinations of elements including elements of Set A of the union of Sets A and B, combinations of elements including elements of Set A of the union of Sets A, B, and C, combinations of elements including elements of Set A in the union of Sets A, B, and D, combinations of elements including elements of Set A in the union of Sets A, B, C, and D, and combinations of elements including element of Set A in the union of Sets of A, B, C, D, and E.

The following is the brief description of advantages obtained from typical inventions among the inventions disclosed in this application.

According to the present invention the composition of dissociated species of a reaction gas can be accurately controlled and etching with a high accuracy and a high selection ratio realized. Therefore, semiconductor integrated circuit arrangements of fine structure and high integration level can be fabricated.

What is claimed is:

1. An integrated circuit device fabrication method, comprising the following steps;

(a) forming a silicon nitride film over a major surface of a wafer; which major surface has a gate structure including a gate electrode and a gate protecting insulation covering side and upper surfaces of the gate electrode, and an isolation region including a recess region and an isolating insulation therein;

(b) forming a silicon oxide film over the silicon nitride film;

(c) forming a patterned masking film over the silicon oxide film;

(d) forming a hole in the silicon oxide film by dry-etching the silicon oxide film using the nitride film as an etching stopper with a cyclic perfluorocarbon gas with three or more carbon atoms under the condition that the patterned masking film exists over the silicon oxide film and an inert gas component occupies no less than 50% of a first gas ambiance around the wafer, thereby exposing the silicon nitride film at the bottom of the hole; and then (e) removing the silicon nitride film at the bottom of the hole by etching the silicon nitride film, thereby exposing the major surface of the wafer at the bottom of the hole between the gate structure and the isolation region.

2. An integrated circuit device fabrication method according to claim 1, wherein the inert gas component that occupies no less than 50% of the first gas ambiance around the wafer is an argon gas.

3. An integrated circuit device fabrication method according to claim 1, wherein the inert gas component occupies no less than 80% of the first gas ambiance around the wafer, and wherein the inert gas component is an argon gas.

4. An integrated circuit device fabrication method according to claim 3, wherein the cyclic perfluorocarbon gas includes $C_4F_8$.

5. An integrated circuit device fabrication method according to claim 3, wherein the removal of the silicon nitride film at the bottom of the hole is performed by a dry-etching.

6. An integrated circuit device fabrication method according to claim 3, wherein the removal of the silicon nitride film at the bottom of the hole is performed by a dry-etching with a non-cyclic fluorocarbon gas, under the condition that the proportion of an inert gas component occupies no less than 80% of a second gas ambiance around the wafer.

7. An integrated circuit device fabrication method according to claim 6, wherein the inert gas component that occupies no less than 80% of the second gas ambiance around the wafer is an argon gas.

8. An integrated circuit device fabrication method according to claim 7, wherein the non-cyclic fluorocarbon gas includes a carbon gas with one carbon atom.

9. An integrated circuit device fabrication method according to claim 8, wherein the non-cyclic fluorocarbon gas is $CH_2F_2$.

* * * * *